(12) United States Patent
Szmanda et al.

(10) Patent No.: US 7,118,847 B2
(45) Date of Patent: *Oct. 10, 2006

(54) POLYMER AND PHOTORESIST COMPOSITIONS

(75) Inventors: Charles R. Szmanda, Westborough, MA (US); George G. Barclay, Jefferson, MA (US); Peter Trefonas, III, Medway, MA (US); Wang Yueh, Shrewsbury, MA (US)

(73) Assignee: Shipley Company LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/970,837

(22) Filed: Oct. 22, 2004

(65) Prior Publication Data

US 2005/0170278 A1    Aug. 4, 2005

Related U.S. Application Data

(63) Continuation of application No. 10/126,191, filed on Apr. 20, 2002, now abandoned, which is a continuation of application No. 09/511,726, filed on Feb. 24, 2000, now Pat. No. 6,406,828.

(51) Int. Cl.
G03C 1/76      (2006.01)
G03C 1/492     (2006.01)
G03C 1/494     (2006.01)
G03C 5/00      (2006.01)

(52) U.S. Cl. .............. 430/270.1; 430/325; 430/326; 430/907

(58) Field of Classification Search .......... 430/270.1, 430/325–326, 907
See application file for complete search history.

(56) References Cited

U.S. PATENT DOCUMENTS

| 5,932,389 | A  | 8/1999  | Zampini         |
| 6,147,249 | A  | 11/2000 | Watanabe et al. |
| 6,207,779 | B1 | 3/2001  | Chang et al.    |
| 6,251,560 | B1 | 6/2001  | Wallow et al.   |
| 6,406,828 | B1 | 6/2002  | Szmanda et al.  |
| 6,444,396 | B1 | 9/2002  | Watanabe et al. |
| 6,599,677 | B1 | 7/2003  | Szmanda et al.  |
| 6,756,180 | B1 | 6/2004  | Li et al.       |

FOREIGN PATENT DOCUMENTS

| EP | 0 492 982 A   | 7/1992 |
| WO | WO 99 42510 A | 8/1999 |

OTHER PUBLICATIONS

Macromolecules, Hall, H.K. et al. 2(5), 1969, 475-488.
Barclay et al., "The Effect of Polymer Architecture on the Aqueous Base Development of Photoresists"; Polym. Prepr. (Am. Chem. Soc., Div. Polym. Chem) (1999), 40(1), pp. 438-439.
Mathew et al., "(n3-Allyl)palladium (II) and Palladium (II) Nitrile Catalysts for the Addition Polymerization of Norbornene Derivatives with Functional Groups", Macromolecules, vol. 29, No. 8, 1996, pp. 2755-2763.
Younkin et al., "Neutral, Single-Component Nickel (II) Polyolefin Catalysts that Tolerate Heteroatoms", Science, vol. 287, Jan. 2000, pp. 460-462.
Dialog/Derwent English Abstract of JP 10310640A.
Chemical Abstracts DN 120:271361.

Primary Examiner—Geraldine Letscher
(74) Attorney, Agent, or Firm—S. Matthew Cairns

(57) ABSTRACT

Disclosed are spirocyclic olefin polymers, methods of preparing spirocyclic olefin polymers, photresist compositions including spirocyclic olefin resin binders and methods of forming relief images using such photoresist compositions.

9 Claims, No Drawings

POLYMER AND PHOTORESIST COMPOSITIONS

This Application is a continuation of application Ser. No. 10/126,191, filed on Apr. 20, 2002, now abandoned, which is a continuation of application Ser. No. 9/511,726, filed on Feb. 24, 2000, now U.S. Pat. No. 6,406,828, issued on Jun. 18, 2002.

BACKGROUND OF THE INVENTION

This invention relates generally to polymer compositions useful in photoresist compositions. In particular, this invention relates to polymer compositions including spirocyclic olefin units useful as binders in photoresist compositions.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

More recently, chemically-amplified type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups comprising a photoresist binder backbone. See, for example, U.S. Pat. Nos. 5,075,199; 4,968,581; 4,810,613; and 4,491,628 and Canadian Patent Application 2,001,384. Upon cleavage of the blocking group through exposure of a coating layer of such a resist, a polar functional group is formed, e.g. carboxyl or imide, which results in different solubility characteristics in exposed and unexposed areas of the resist coating layer. See also R. D. Allen et al. *Proceedings of SPIE*, 2724:334–343 (1996); and P. Trefonas et al. *Proceedings of the 11th International Conference on Photopolymers* (*Soc. of Plastics Engineers*), pp 44–58 (Oct. 6, 1997).

While currently available photoresists are suitable for many applications, current resists can also exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by a KrF laser) or 193 nm (provided by an ArF exposure tool). Use of such short exposure wavelengths can enable formation of smaller features. Accordingly, a photoresist that yields well-resolved images upon 248 or 193 nm exposure could enable formation of extremely small (e.g. sub-quarter micron) features that respond to constant industry demands for smaller dimension circuit patterns, e.g. to provide greater circuit density and enhanced device performance.

However, many current photoresists are generally designed for imaging at relatively higher wavelengths, such as I-line (365 nm) and G-line (436 nm) exposures, and are generally unsuitable for imaging at short wavelengths, such as 248 nm and 193 nm. In particular, prior resists exhibit poor resolution (if any image at all can be developed) upon exposure to these shorter wavelengths. Among other things, current photoresists can be highly opaque to extremely short exposure wavelengths, such as 248 nm and 193 nm, thereby resulting in poorly resolved images. Efforts to enhance transparency for short wavelength exposure can negatively impact other important performance properties such as substrate adhesion or swelling, which in turn can dramatically compromise image resolution.

Cyclic monomer units, particularly those containing functional groups, impart various properties to the resin binder when incorporated into the backbone of the resin binder. Anhydrides incorporated into the resin binder backbone help reduce swelling. For example, Barclay et al., *The Effect of polymer Architecture on the Aqueous Base development of Photoresists, Polym. Prepr.* (American Chemical Society, Division of Polymer Chemistry), volume 40(1), pages 438–439, 1999, discloses the incorporation of itaconic anhydride into a photoresist resin binder, such as a (meth)acrylic polymer. However, such anhydrides can undergo hydrolysis in the presence of alcohols or other solvents, especially solvents that are contaminated with small amounts of water.

Such swelling of resin binders could be even further reduced or eliminated through the use of a binder containing a high proportion of cyclic monomers in the polymer backbone, particularly cyclic monomers containing functional groups. One approach for achieving this is to use only cyclic monomers in the preparation of the polymer. However, this approach suffers from the difficulty in polymerizing such cyclic monomers, especially when the cyclic monomers contain electron withdrawing groups, such as anhydrides. In particular, 5-norbornene-2,3-dicarboxylic anhydride cannot be easily polymerized.

For example, WO 99/42510 discloses resins useful in photoresist compositions wherein the resin is composed of norbornyl monomers containing various functional groups. This patent application is directed to a method for preparing a polycyclic polymer and introducing difficult to polymerize functionalities into the polymer by post-polymerization functionalization. Such post polymerization treatment avoids the use of monomers containing such difficult to polymerize functionalities as nitrogen containing groups, such as amides, and hydroxyl containing groups, such as alcohols and carboxylic acids. The post polymerization functionalization is achieved by using cyclic monomers containing protected functionalities, deprotecting the functionality to give a free functionality and then reacting the free functionality to give a post-functionalized moiety. Drawbacks of this invention are that the mass of the polymer resin may change, resulting in shrinkage of the polymer, and a number of extra steps are required which greatly adds to the time and cost of the preparation.

Polymers containing tricyclic nornornenyl monomers composed of a norbornyl ring fused to a 5-membered anhydride ring are disclosed in WO 99/42510. However, spirocyclic monomers are not disclosed in that patent application.

Japanese Patent Application JP 10 310 640 A, to Maruzen Petrochem Co. Ltd., discloses a variety of spirocyclic olefin monomers including those containing lactone and imide functional groups. Spiropolyimides are also disclosed, however, such polyimides are bound to the polymer backbone through the imide nitrogen groups. This patent application does not disclose spirocyclic monomer units bound to the polymer backbone through the olefinic carbons of the spirocyclic olefin monomers.

It is thus desirable to have photoresist compositions that can be imaged at short wavelengths, contain resin binders having reduced swelling and have better substrate adhesion than known photoresist compositions. It is further desirable to have photoresist compositions containing resin binders that have mass persistence and can be prepared with few reactions or transformations.

SUMMARY OF THE INVENTION

It has been surprisingly found that polymers containing spirocyclic monomers can be readily obtained without the use of ring-opening polymerizations. It has also been surprisingly found that resin binders can be prepared having a high proportion of cyclic monomers in the polymer backbone, including cyclic monomers having electron withdrawing functional groups. It has further been surprisingly found that such spirocyclic resin binders include, as polymerized units, spirocyclic monomers bound to the polymer backbone through the monomer olefinic carbons.

In one aspect, the present invention provides a polymer including as polymerized units one or more spirocyclic olefin monomers, wherein the spirocyclic olefin monomers are bound to the polymer backbone through the olefinic carbons, and optionally one or more ethylenically or acetylenically unsaturated monomers.

In a second aspect, the present invention provides a method of polymerizing one or more spirocyclic olefinic monomers to form a polymer including as polymerized units one or more spirocyclic olefin monomers, including the step of contacting the one or more spirocyclic olefinic monomers with one or more catalysts selected from palladium(II) polymerization catalyst, nickel(II) polymerization catalyst and free radical polymerization catalyst.

In a third aspect, the present invention provides a photoresist composition including a resin binder including as polymerized units one or more spirocyclic olefin monomers, wherein the spirocyclic olefin monomers are bound to the polymer backbone through the olefinic carbons, optionally one or more ethylenically or acetylenically unsaturated monomers and a photoactive component.

In a fourth aspect, the present invention provides a method for forming a photoresist relief image, including the steps of applying a coating layer of the photoresist composition described above; exposing the photoresist coating layer to patterned activating radiation; developing the exposed photoresist coating layer to provide a photoresist relief image.

DETAILED DESCRIPTION OF THE INVENTION

As used throughout this specification, the following abbreviations shall have the following meanings, unless the context clearly indicates otherwise: ° C.=degrees Centigrade; g=gram; mol=mole; mol %=percent by moles; w/w=weight per weight basis; mmol=millimole; ml=milliliter; mm=millimeter; nm=nanometer; Ar=aryl; and sec=second.

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Polymers" refer to both homopolymers and copolymers. The term "(meth)acrylate" refers to both acrylate and methacrylate. Likewise, the term "(meth)acrylic" refers to both acrylic and methacrylic.

All amounts are percent by weight and all ratios are by weight, unless otherwise noted. All numerical ranges are inclusive.

The present invention provides a polymer including as polymerized units one or more spirocyclic olefin monomers. The term "spirocyclic" as used herein has its conventional meaning, that is, any compound containing two or more rings wherein two of the rings have one ring carbon in common. By "spirocyclic olefin" is meant any spirocyclic compound having a double bond. "Sprirocyclic olefin monomer" refers to any spirocyclic olefin capable of being polymerized.

The polymers of the present invention contain from 1 to 100 percent by weight, based on the total weight of the monomers, of one or more spirocyclic monomers. Thus the polymers of the present invention may be homopolymers or copolymers of spirocyclic olefin monomers. It will be appreciated by those skilled in the art that any ethylenically unsaturated monomer, acetylenically unsaturated monomer or mixtures thereof may be copolymerized with the spirocyclic olefin monomers of the present invention. Such ethylenically or acetylenically unsaturated monomer or mixtures thereof may be present in the polymers of the present invention in an amount in the range of 1 to 99 percent by weight, based on the total weight of the monomers.

Any spirocyclic olefin monomer is useful in the polymers of the present invention. It is preferred that at least one ring of the spirocyclic olefin monomer is a 5- to 7-membered ring, and more preferably both spirocyclic rings are 5- to 7-membered rings. Suitable spirocyclic olefin monomers useful in the present invention include those of Formula I

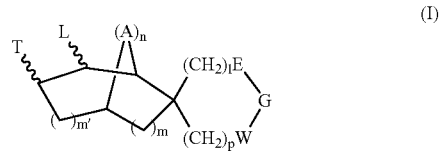

(I)

wherein A=O, S, $CH_2$, and $NR^1$; $R^1$=phenyl, substituted phenyl, benzyl, substituted benzyl, $(C_1–C_8)$alkyl and substituted $(C_1–C_8)$alkyl; G=C(Z'), O, S, and $NR^2$; $R^2$=$(C_1–C_8)$ alkyl and substituted $(C_1–C_8)$alkyl; E and W are independently selected from C(Z'), O, $NR^2$ and a chemical bond; Z'=O or S; n=0 to 3; m=0 to 2; m'=0 to 2; 1=0 to 5; and p=0 to 5; provided that 1+p=3 to 5; provided that when A=O, S or NR¹, n=1; wherein T and L are taken together and selected from a double bond or a 5 to 8-membered unsaturated ring.

Suitable spirocyclic monomers of the present invention wherein T and L are joined to form a 5 to 8-membered unsaturated ring include those having the Formula Ia

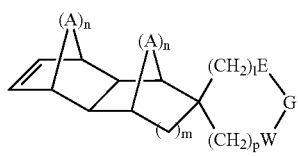

(Ia)

wherein A, E, W, G, l, m, n and p are as defined above.

It is preferred that the spirocyclic olefin monomers of the present invention have the structure of Formula Ib

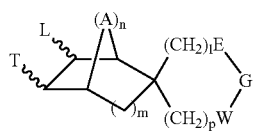

(Ib)

wherein A, E, W, G, l, m, n and p are as defined above. More preferably, the spirocyclic olefin monomers have the structure of Formula Ic

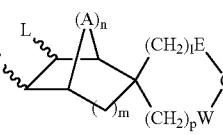

(Ic)

wherein A, E, W, G, l, m, n and p are as defined above. It is further preferred that n is 1 or 2. It is still further preferred that A is $CH_2$. It is also preferred that m is 0 or 1.

By "substituted phenyl" is meant a phenyl ring having one or more of its hydrogens replaced with another substituent group. By "substituted benzyl" is meant a benzyl group having one or more of its hydrogens replaced with another substituent group. Suitable substituent groups include, but are not limited to, cyano, halo, $(C_1-C_4)$alkoxy, $(C_1-C_4)$alkyl, amino, $(C_1-C_4)$alkylamino, $(C_1-C_4)$dialkylamino, $(C_1-C_4)$alkylthio, and the like.

The spirocyclic olefin monomers useful in the present invention may be optionally substituted. By substituted is meant that one or more of the hydrogens on the ring carbons is replaced by one or more substituent groups. Suitable substituent groups include $(C_1-C_{12})$alkyl, phenyl, substituted phenyl, $(C_1-C_{12})$alkoxy, $(C_7-C_{10})$alkaryl, $(C_1-C_8)$perhaloalkyl, and halogen. Preferred substituents are $(C_1-C_{12})$alkyl, more preferably $(C_1-C_4)$alkyl, and most preferably $(C_1-C_2)$alkyl.

Preferred spirocyclic olefin monomers are those containing electron withdrawing groups within at least one of the spirocyclic rings. As used herein, spirocyclic olefin monomers containing electron withdrawing groups are intended to include compounds having groups such as carbonyl, thiocarbonyl, oxa, mercapto, amino, substituted amino, amido, and the like as ring atoms. Suitable electron withdrawing groups include, but are not limited to anhydrides, thioanhydrides, lactones, thiolactones, imides, thioimides, lactams and thiolactams. It is preferred that the electron withdrawing groups are anhydrides, lactones, imides and lactams, and more preferably anhydrides and lactones. It is further preferred that such electron withdrawing groups are alpha to the spirocarbon.

Suitable spirocyclic olefin monomers include, but are not limited to, spirocyclic norbornyl monomers, spirocyclic cyclohexene monomers, spirocyclic cyclopentene monomers and mixtures thereof. Suitable spirocyclic norbornyl monomers include those having a 5-membered spirocycle, such as those of Formulae II and III

(II)

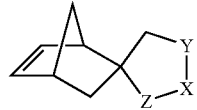

(III)

wherein $Z=CH_2$, $C(O)$, $C(S)$, O or S; X and Y are independently selected from $CH_2$, $C(O)$, $C(S)$, O or $NR^2$; and $R^2=(C_1-C_8)$alkyl and substituted $(C_1-C_8)$alkyl; provided that at least one of X, Y and Z is selected from $C(O)$ or $C(S)$; and wherein the spirocyclic monomer is optionally substituted.

Preferred spirocyclic norbornyl olefin monomers of Formulae II and III are those wherein Z is $C(O)$, and more preferably wherein Z is $C(O)$ and X is oxygen. Spirocyclic norbornyl olefin monomers having a carbonyl or thiocarbonyl in the exo position are preferred in certain polymerizations as polymerizations of such exo monomers are believed to be faster than that of the corresponding endo monomers. Thus, for example, spirocyclic norbornyl olefin monomers of Formula II are preferred when Z is $C(O)$ or $C(S)$.

The spirocyclic olefinic monomers useful in the present invention are generally known in the literature. For example, Griffini, *Heterocycles*, volume 16, number 5, pages 775–788, 1981, discloses various spirocyclic olefinic imides, herein incorporated by reference to the extent this article teaches the preparation of such compounds.

In general, the spirocyclic olefin monomers of the present invention may be prepared by a Diels-Alder reaction of a cyclic hydrocarbon containing an exo double bond with butadiene, a substituted butadiene, a cyclodiene, such as cyclopentadiene or 1,3-cyclohexadiene, or a substituted cyclodiene. Such reaction is illustrated in the following Reaction Scheme.

Reaction Scheme

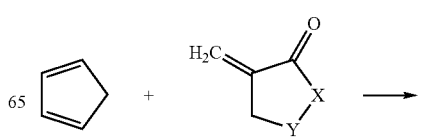

-continued

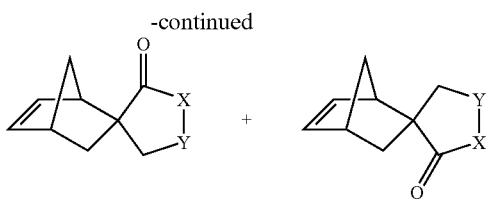

The ethylenically or acetylenically unsaturated monomers that may be used in the present invention are any that will copolymerize with the spirocyclic olefinic monomers of the present invention. It will be appreciated by those skilled in the art that one or more ethylenically or acetylenically unsaturated monomers may be copolymerized with the spirocyclic olefinic monomers of the present invention. The total amount of the ethylenically and acetylenically monomers useful in the polymer of the present invention is from 1 to 99 percent by weight, based on the total weight of the monomers, preferably from 10 to 95 percent by weight, more preferably from 20 to 90 percent by weight, and even more preferably from 60 to 90 percent by weight.

Suitable ethylenically or acetylenically unsaturated monomers include, but are not limited to: (meth)acrylic acid, (meth)acrylamides, alkyl(meth)acrylates, alkenyl(meth)acrylates, aromatic(meth)acrylates, vinyl aromatic monomers, nitrogen-containing compounds and their thio-analogs, substituted ethylene monomers, cyclic olefins, substituted cyclic olefins, and the like.

Typically, the alkyl(meth)acrylates useful in the present invention are ($C_1$–$C_{24}$)alkyl (meth)acrylates. Suitable alkyl (meth)acrylates include, but are not limited to, "low cut" alkyl (meth)acrylates, "mid cut" alkyl(meth)acrylates and "high cut" alkyl(meth)acrylates.

"Low cut" alkyl(meth)acrylates are typically those where the alkyl group contains from 1 to 6 carbon atoms. Suitable low cut alkyl(meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl(meth)acrylates are typically those where the alkyl group contains from 7 to 15 carbon atoms. Suitable mid cut alkyl(meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl(meth)acrylates are typically those where the alkyl group contains from 16 to 24 carbon atoms. Suitable high cut alkyl(meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl(meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl(meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25 L, and naturally derived alcohols such as Proctor & Gamble's TA-1618 and CO-1270. Consequently, for the purposes of this invention, alkyl (meth)acrylate is intended to include not only the individual alkyl(meth)acrylate product named, but also to include mixtures of the alkyl(meth)acrylates with a predominant amount of the particular alkyl (meth)acrylate named.

The alkyl(meth)acrylate monomers useful in the present invention may be a single monomer or a mixture having different numbers of carbon atoms in the alkyl portion. Also, the (meth)acrylamide and alkyl(meth)acrylate monomers useful in the present invention may optionally be substituted. Suitable optionally substituted (meth)acrylamide and alkyl(meth)acrylate monomers include, but are not limited to: hydroxy ($C_2$–$C_6$)alkyl(meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or HPMA.

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl)acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl(meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, and mixtures thereof.

The vinyl aromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$) alkyl, carb($C_1$–$C_{10}$)alkoxy, carboxy, amino, ($C_1$–$C_{10}$)alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide and itaconic anhydride.

Suitable cyclic olefin monomers useful in the present invention are ($C_5$–$C_{10}$)cyclic olefins, such as cyclopentene, cyclopentadiene, dicylopentene, cyclohexene, cyclohexadiene, cycloheptene, cycloheptadiene, cyclooctene, cyclooctadiene, norbornene, maleic anhydride and the like. Suitable substituted cyclic olefin monomers include, but are not limited to, cyclic olefins having one or more substituent groups selected from hydroxy, aryloxy, halo, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl such as $(CH_2)_{n'}C(CF_3)_2OH$ where n'=0 to 4, ($C_1$–$C_{12}$)alkoxy, thio, amino, ($C_1$–$C_6$)alkylamino, ($C_1$–$C_6$) dialkylamino, ($C_1$–$C_{12}$)alkylthio, carbo($C_1$–$C_{20}$)alkoxy, carbo($C_1$–$C_{20}$)haloalkoxy, ($C_1$–$C_{12}$)acyl, ($C_1$–$C_6$)alkylcarbonyl($C_1$–$C_6$)alkyl, and the like. Particularly suitable substituted cyclic olefins include maleic anhydride and cyclic olefins containing one or more of hydroxy, aryloxy, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl, carbo($C_1$–$C_{20}$)alkoxy, and carbo($C_1$–$C_{20}$)haloalkoxy. It will be appreciated by those skilled in the art that the alkyl and alkoxy substituents may be optionally substituted, such as with halogen, hydroxyl, cyano, ($C_1$–$C_6$)alkoxyl, mercapto, ($C_1$–$C_6$)alkylthio, amino, acid labile leaving group and the like.

Suitable carbo($C_1$–$C_{20}$)alkoxy substituents include, but are not limited to, those of the formula C(O)O-LG, wherein LG is a leaving group having 4 or more carbon atoms with at least one quaternary carbon atom bonded directly to the carboxyl group. Suitable leaving groups include, but are not limited to, isobutyl, 2,3-dimethylbutyl, 2,3,4-trimethylpentyl and alicyclic leaving groups. Suitable alicyclic leaving groups include adamantyl, methyladamantyl, ethyladamantyl, methylnorbornyl, ethylnorbornyl, ethyltrimethylnorbornyl, and the like. Particularly useful alicyclic leaving groups are those of Formulae IVa–IVd.

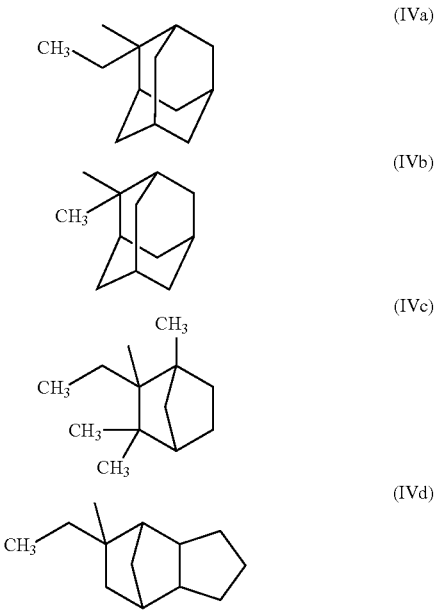

Other particularly useful cyclic olefin monomer substituents include, but are not limited to, Ar—O-LG and $(CH_2)_{n'}C(CF_3)_2$O-LG where n'=0 to 4, wherein LG is as described above. It is preferred that the aryl group is phenyl.

Suitable ethylenically unsaturated cyclic olefins having one or more hydroxy groups include, but are not limited to, norbornenyl alcohols of Formula (V)

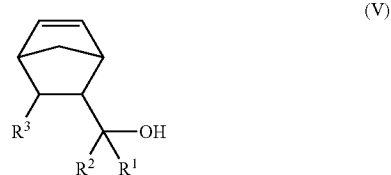

wherein $R^1$, $R^2$ and $R^3$ are independently hydrogen and ($C_1$–$C_8$)alkyl and wherein $R^1$ and $R^3$ may be joined to form a 5- to 7-member fused ring. It is preferred that $R^1$ and $R^3$ are independently selected from hydrogen or ($C_1$–$C_8$)alkyl, $R^2$=cyclohexyl or cyclopentyl, and $R^2$ and $R^3$ may be joined to form a 5- to 7-member fused ring. It is further preferred that $R^1$ is hydrogen or methyl. Particularly useful norbornenyl alcohols are those of the Formulae Va–Vc.

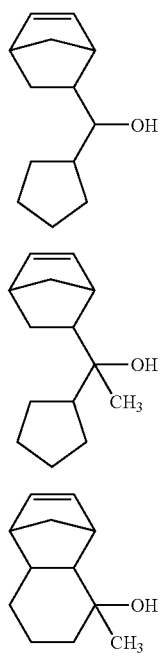

The spirocyclic polymers of the present invention may be prepared by a variety of methods, such as free-radical polymerization and metal catalyzed polymerization. Any catalyst is suitable for use in the present invention as long as it catalyzes the polymerization of the double bond of the spirocyclic olefinic monomers without substantially opening the rings of the spirocyclic monomer. Metal catalyzed polymerizations are preferred. Suitable free-radical polymerization catalysts include, but are not limited to: hydrogen peroxide, tert-butyl hydroperoxide, sodium persulfate, potassium persulfate, lithium persulfate; and the like. Such free-radical polymerization conditions will be clear to those skilled in the art.

It will be appreciated by those skilled in the art that more than one metal catalyst may be used in the polymerizations of the present invention. Suitable metal polymerization catalysts include, but are not limited to, palladium(II) catalysts, such as palladium dihalide, nonionic palladium(II)-halide complexes, (Pd(RCN)$_4$)(BF$_4$)$_2$, where R is (C$_1$–C$_4$) alkyl, palladium(II)-alkyl complexes, and ($\eta^3$-allyl) palladium(II) compounds with weakly coordinating counterions. Preferred palladium(II) catalysts are (Pd(RCN)$_4$)(BF$_4$)$_2$, where R is (C$_1$–C$_4$)alkyl, ($\eta^3$-allyl)palladium(II) compounds with weakly coordinating counterions, and mixtures thereof. Particularly useful palladium(II) catalysts include, but are not limited to: (Pd(CH$_3$CN)$_4$)(BF$_4$)$_2$, (Pd(C$_2$H$_5$CN)$_4$)(BF$_4$)$_2$, ($\eta^3$-allyl)Pd(BF$_4$), (($\eta^3$-allyl) PdCl)$_2$, ($\eta^3$-allyl)Pd(SbF$_6$), and mixtures of ($\eta^3$-allyl)Pd (BF$_4$) and ($\eta^3$-allyl)Pd(SbF$_6$). Such catalysts are generally known, see, for example, Mathew et al., ($\eta^3$-*Allyl*)*palladium* (*II*) *and Palladium*(*II*) *Nitrile Catalysts for the Addition Polymerization of Norbornene Derivatives with Functional Groups, Macromolecules*, vol. 29, pages 2755–2763, 1996, herein incorporated by reference to the extent it teaches the preparation and use of such catalysts.

Other suitable metal polymerization catalysts include nickel(II) catalysts having as ligands at least one of salicylaldimine or substituted salicylaldimine and at least one of acetonitrile or a phosphine, such as triphenylphosphine. Suitable substituted salicylaldimine ligands include those substituted in the ortho position to the oxygen with a bulky group, such as phenyl, substituted phenyl, anthracene, substituted anthracene, triphenylmethyl, meta-terphenyl and the like. Suitable catalysts are those disclosed in Younkin et al., *Neutral, Single-Component Nickel* (*II*) *Polyolefin Catalysts that Tolerate Heteroatoms, Science*, vol. 287, pp 460–462, Jan. 21, 2000.

The ratio of monomer to metal catalyst in the polymerization reaction of the present invention can range from about 5000:1 to about 25:1, preferably from 1000:1 to 50:1, and more preferably from 100:1 to 50:1. The polymerization reaction using this catalyst can be run in a hydrocarbon solvent, such as cyclohexane, toluene, benzene, nitrobenzene, chlorobenzene, nitromethane, dichloromethane and mixtures thereof. A particularly useful solvent mixture is nitrobenzene and dichlorobenzene in a 4:1 ratio. The polymerization reactions using palladium(II) catalysts can be carried out at a temperature in the range of from about 0° to about 70° C. It is preferred that the polymerization reaction is carried out at a temperature of 10° to 50° C., and more preferably 20° to 40° C. The yields for the polymerizations are typically in the range of 25 to 100%.

The spirocyclic polymers of the present invention may be used in any application where cyclic polymers may be useful. The spirocyclic polymers of the present invention are particularly useful in electronics applications, such as, but not limited to, photoresist compositions, antireflective coating compositions, soldermasks, dielectrics, and the like. Spirocyclic polymers of the present invention containing as polymerized units one or more spirocyclic olefin monomers containing one or more electron withdrawing groups are particularly suitable for use as resin binders in photoresist compositions. When used in photoresist compositions, such spirocyclic polymers of the present invention show reduced swelling and improved adhesion over known photoresist compositions.

Particularly suitable spirocyclic polymers of the present invention for use in photoresist compositions include those of Formula VIa and VIb

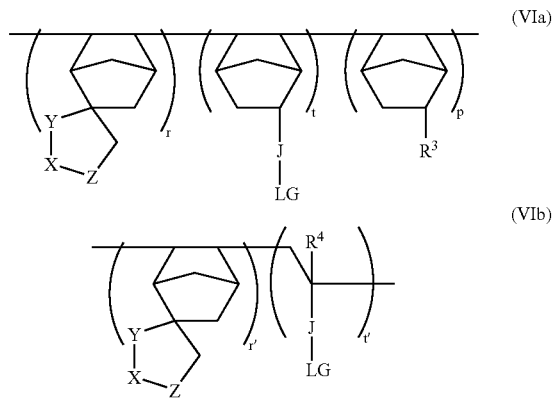

wherein Z=CH$_2$, C(O), C(S), O or S; X and Y are independently selected from CH$_2$, C(O), C(S), O or NR$^2$; R$^2$= (C$_1$–C$_8$)alkyl and substituted (C$_1$–C$_8$)alkyl; R$^3$=C(O)O (CH$_2$)$_q$OH, H and C(O)OR$^4$; R$^4$=(C$_1$–C$_{24}$)alkyl and H; J=C(O)O—, Ar—O— and (CH$_2$)$_n$, C(CF$_3$)$_2$—O—; LG is leaving group having 4 or more carbon atoms with at least one quaternary carbon atom bonded directly to the carboxyl group; q is an integer from 0 to 20; n'=0 to 4; r is 10 to 60 percent by weight of the monomer unit, based on the total weight of the monomers; r' is 10 to 80 percent by weight of the monomer unit, based on the total weight of the monomers; t is 10 to 90 percent by weight of the monomer unit, based on the total weight of the monomers; t' is 20 to 90 percent by weight of the monomer unit, based on the total weight of the monomers; and p is 0 to 80 percent by weight of the monomer unit, based on the total weight of the monomers. It is preferred that the t+p is in the range of 20 to 90 percent by weight based on the total weight of the monomers, and more preferably in the range of 60 to 90 percent by weight.

Other particularly suitable spirocyclic polymers of the present invention, particularly for use in photoresist systems, include as polymerized units one or more spirocyclic olefin monomers of the present invention, maleic anhydride, one or more cyclic olefin monomers having as a substituent a leaving group as described herein and optionally one or more other monomers. Suitable optional monomers in these polymers include, but are not limited to, norbornene, itaconic anhydride, (meth)acrylate esters and the like.

Other particularly suitable spirocyclic polymers of the present invention for use in photoresist compositions are those containing as polymerized units one or more spriocyclic olefin monomers of Formulae VII and VIII

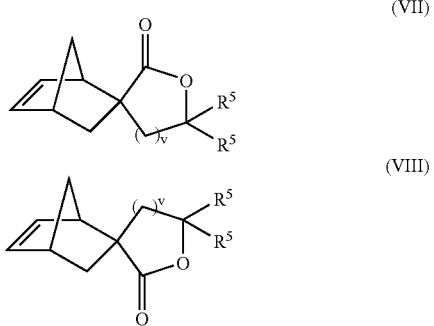

wherein $R^5=(C_1-C_{24})$alkyl and v is an integer between 1 and 4. It is preferred that $R^5=(C_1-C_6)$alkyl, and more preferably $(C_1-C_4)$alkyl. While not intending to be bound by theory, it is believed that in certain cases, such as when v is 3 or greater, such spirocyclic olefin monomers may ring open in the presence of an acid to yield a norbornyl compound containing as pendant groups both a carboxylic acid and an alkene. Thus, such spirocyclic monomer units, when polymerized into a polymer, may also ring open in the presence of an acid. Such ring opening affords a cyclic polymer backbone having carboxylic acid functionality and an alkenyl group without the loss of any significant mass. Thus, not only can an acid functionality can be introduced into a cyclic polymer backbone with fewer reaction steps than known methods, but the resulting spirocyclic polymers show mass persistence, that is, they do not significantly shrink. Spirocyclic polymers containing as polymerized units one or more 7-membered or higher-membered spirocyclic olefin monomers are thus particularly useful in photoresist compositions.

The photoresist compositions of the present invention include one or more photoactive components, one or more spirocyclic resin binders of the present invention, and optionally one or more additives. The photoactive components useful in the present invention are typically photoacid or photobase generators, and preferably photoacid generators.

The photoacid generators useful in the present invention are any compounds which liberate acid upon exposure to light, typically at a wavelength of about 320 to 420 nanometers, however other wavelengths may be suitable. Suitable photoacid generators include halogenated triazines, onium salts, sulfonated esters and halogenated sulfonyloxy dicarboximides.

Particularly useful halogenated triazines include halomethyl-s-triazines. Suitable halogenated triazines include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidene]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-furfylethylidene)-4,6-bis(tribromomethyl)-1,3,5-triazine, 2-[2-(5-methylfuryl)ethylidene]-4,6-bis(tribromomethyl)-1,3,5-triazine, 2-[2-(4-methylfuryl)-ethylidene]-4,6-bis(tribromomethyl)-1,3,5-triazine, 2-[2-(3-methylfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis(tribromomethyl)-1,3,5-triazine, 2-[2-(2-(3-methoxyfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3, 337–340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3(2H)-dione; 2-(((trifluoromethyl)sulfonyl)oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3(2H)-dione; 2-(((trifluoromethyl)sulfonyl)oxy)-1H-benz(de)isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl)oxy)-4,7-epoxy-1H-isoindole-1,3(2H)-dione; 2,6-bis-(((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,3aH,6H)-tetrone; 1,8,8-trimethyl-3-(((trifluoromethyl)sulfonyl)oxy)-3-azabicyclo(3.2.1)octane-2,4-dione; 4,7-dihydro-2-(((trifluoromethyl)sulfonyl)oxy)-4,7-epoxy-1H-isoindole-1,3(2H)-dione; 3-(1-naphthalenyl)-4-phenyl-1-(((trifluoromethyl)sulfonyl)oxy)-1H-pyrrole-2,5-dione; 3,4-diphenyl-1-(((trifluoromethyl)sulfonyl)oxy)-1H-pyrrole-2,5-dione; 5,5'-(2,2,2-trifluoro-1-(trifluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1aH,4H)-dione; 5,5'-oxybis-2-(((trifluoromethyl)sulfonyl)oxy)-1H-isoindole-1,3(2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1(((trifluoromethyl)sulfonyl)oxy)-1H-pyrrole-2,5-dione; N-((perfluorooctanesulfonyl)oxy)-5-norbornene-2,3-dicarboximide; and 1-(((trifluoromethyl)sulfonyl)oxy)-2,5-pyrrolidinedione, and more preferably N-((perfluorooctanesulfonyl)oxy)-5-norbornene-2,3-dicarboximide.

The photoactive components are typically added to photoresist compositions in an amount sufficient to generate a latent image in a coating layer of resist material upon exposure to activating radiation. When the photoactive component is a photoacid generator, the amount is typically in the range of 0.1 to 10 percent by weight, based on the weight of the resin, and preferably 1 to 8 percent by weight. It will be appreciated by those skilled in that art that more than one photoacid generators may be used advantageously in the photoresist compositions of the present invention.

Any spirocyclic polymers of the present invention may be advantageously used as the resin binders in the photoresist compositions of the present invention. It will appreciated by those skilled in the art that more than one resin binder may be used in the photoresist compositions of the present invention, including more than one spirocyclic resin binder. Thus, the spirocyclic resin binders of the present invention may be advantageously combined with one or more other resin binders.

The optional additives that may be used in the photoresist compositions of the present invention include, but are not limited to: anti-striation agents, plasticizers, speed enhancers, fillers, dyes and the like. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

The photoresist compositions of the present invention may be readily prepared by those skilled in the art. For example, a photoresist composition of the invention can be prepared by dissolving the components of the photoresist in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof. When the resin binder is a spirocyclic lactone polymer, it is preferred that the solvent comprises γ-butyrolactone, and more preferably the solvent is a mixture of γ-butyrolactone and 2-heptanone. Thus, it is preferred that photoresist compositions comprising spirocyclic resin binders including as polymerized units spirocyclic olefin monomers of Formula I, and preferably those of Formulae VII or VIII, contain γ-butyrolactone.

Typically, the solids content of the photoresist composition varies from about 5 to about 35 percent by weight, based on the total weight of the composition. The resin binder and photoacid generators should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

Photoresist compositions including the spirocyclic polymers of the present invention are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass and the like are also suitable employed as substrates for the photoresist compositions of the invention.

Once the photoresist composition is coated on a substrate surface, it is dried by heating to remove any solvent. It is preferably dried until the coating is tack free. Thereafter, it is imaged through a mask in a conventional manner. The exposure is sufficient to effectively activate the photoacid component of the photoresist to produce a patterned image in the resist coating layer, and more specifically, the exposure energy typically ranges from about 1 to 100 mJ/cm$^2$, dependent upon the exposure tool and the components of the photoresist composition.

The photoresist compositions of the present invention are preferably activated by a short exposure wavelength, particularly a sub-300 nm, such as UV, and more preferably a sub-200 nm exposure wavelength. Particularly preferred wavelengths include 248, 193, 157 nm and 11–15 nm. However, the photoresist compositions of the present invention may be used at higher wavelengths, such as, but not limited to, visible, e-beam and x-ray.

Following exposure, the film layer of the composition is preferably baked at temperatures ranging from about 70° C. to 160° C. Thereafter, the film is developed. The exposed resist film is rendered positive working by employing a polar developer, preferably an aqueous based developer, such as quarternary ammonium hydroxide solutions, such as tetraalkyl ammonium hydroxide, preferably a 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

After development of the photoresist coating, the developed substrate may be selectively processed on those areas bared of resist, for example, by chemically etching or plating substrate areas bared of resist in accordance with procedures known in the art. For the manufacture of microelectronic substrates, e.g. the manufacture of silicon dioxide wafers, suitable etchants include, but are not limited to, a gas etchant, such as a chlorine- or fluorine-based etchant, such as $Cl_2$ or $CF_4/CHF_3$ etchant applied as a plasma stream. After such processing, the resist may be removed from the processed substrate using any stripping procedures known in the art.

The following examples are intended to illustrate further various aspects of the present invention, but are not intended to limit the scope of the invention in any aspect.

EXAMPLE 1

Norbornene butyrolactone (or 4',5'-dihydro-(1a,2a,4a)-spiro[bicyclo[2.2.1]hept-5-ene-2,3'(2'H)-furan]-2'-one) was prepared as follows. Methylene butyrolactone was dissolved in dichloromethane and freshly cracked cyclopentadiene was added. The reaction mixture was stirred at room temperature for 3 hours, heated to 40° C. and held at 40° C. overnight. The reaction mixture was then slowly cooled to room temperature. The methylene chloride was removed under reduced pressure, leaving an oil. The crude oil was then distilled under reduced pressure to afford pure product.

EXAMPLE 2

Norbornene valerolactone was prepared as follows. A solution of valerolactone (50.1 g) in 150 mL of anhydrous THF was placed in a three-neck-bottomed flask at −78° C. (dry ice/acetone bath). To it, solution of lithium dimethylamine ("LDA") (250 mL, 2M) in 250 mL anhydrous THF was added dropwise. The reaction mixture was stirred at this temperature for 4 hours. Then, the thermal cracking of paraformaldehyde (36.94 g, excess) was bubbled into the reaction mixture. After the paraformaldehyde was all cracked, the reaction mixture was stirred overnight and allowed to gradually warm to room temperature. Then, the solvent was removed by rotary pump and the residue was added 500 mL dichloromethane and washed with $NaHCO_3$ (aq, sat.) and water several times (3×500 mL). The organic solvent was dried over $MgSO_4$ and then removed by rotary pump. The desired product, methylene-valerolactone, was distilled under vacuum (135–140° C./8 mm Hg).

The methylene-valerolactone was then dissolved in dichloromethane and freshly cracked cyclopentadiene was added. The reaction mixture was stirred at room temperature for 3 hours, then heated to 40° C., and held at 40° C. overnight. The reaction mixture was then slowly cooled to room temperature. The dichloromethane was removed under reduced pressure, leaving an oil. The crude oil was then distilled under reduced pressure to afford pure product.

EXAMPLE 3

To a 50 ml glass vial equipped with a Teflon coated stir bar is added 2.64 g (13.6 mmol) of 5-norbornenecarboxylic acid tert-butyl ester, 0.952 g (5.34 mmol) of spiro[bicyclo[2.2.1]hept-5-ene-2,3'(2'H)-furan]-2',5'(4'H)-dione, as shown by the following formula

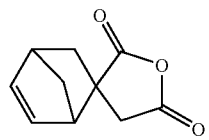

together with 50 ml of freshly distilled dichloroethane. The solution is degassed under an argon atmosphere. A 10 ml glass vial equipped with a Teflon coated stir bar is then charged with 0.0365 g (0.1 mmol) of h$^3$-allylpalladium chloride dimer and 2 ml of dichloroethane. Another 10 ml glass vial is charged with 0.0195 g (0.1 mmol) of silver tetrafluoroborate and 2 ml of dichloroethane. The catalyst solution is then prepared by mixing the allylpalladium chloride dimer solution with silver tetrafluoroborate solution inside a dry box. Silver chloride salt will immediately precipitate, which is then filtered, and a clear yellow solution is obtained. This active yellow catalyst solution is added to the monomer solution via a syringe and the reaction mixture is allowed to stir for 20 hours at 60° C. Solids that form typically precipitate in the solution. The solution is cooled, concentrated in a rotary-evaporator, and precipitated into hexane to obtain the polymer.

EXAMPLE 4

The polymer from Example 3 (1.4 g) is placed in a bottle, together with 0.0895 g of triphenyl sulfonium trifluoromethane sulfonate (TPS-Triflate), 0.00165 g of 1,8-diazabicyclo[5.4.0]undec-7-ene (DBU), 6.11 g of methyl amyl ketone and 3.05 g of propylene glycol methyl ether acetate. The mixture is then stirred on a rolling mill until all solids completely dissolve. The solution is then filtered through a 0.05 mm porous filter into a clean bottle. The resulting resist is spun on a silicon wafer, baked on a hot plate at 135° C.

for 60 sec, exposed on an ISI 193 nm step-and-repeat printer, post-exposure baked at 155° C. for 60 sec and then developed in an aqueous solution of 2.38% tetramethylammonium hydroxide. Typically, adhesion is improved and little or no swelling of the resist features is observed.

EXAMPLE 5

To a 50 ml glass vial equipped with a Teflon coated stir bar is added 1.943 g (10.0 mmol) of TBN-CA, 1.64 g (10.0 mmol) of 4',5'-dihydro-(1a,2a,4a)-spiro[bicyclo[2.2.1]hept-5-ene-2,3'(2'H)-furan]-2'-one, as shown by the following formula

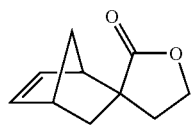

together with 50 ml of freshly distilled dichloroethane. The solution is degassed under an argon atmosphere. A 10 ml glass vial is equipped with a Teflon coated stir bar and then is charged with 0.0365 g (0.1 mmol) of η³-allylpalladium chloride dimer and 2 mL of dichloroethane. Into another 10 mL glass vial is charged with 0.0195 g (0.1 mmol) of silver tetrafluoroborate and 2 mL of dichloroethane. The catalyst solution is prepared by mixing the allylpalladium chloride dimer solution with silver tetrafluoroborate solution inside a dry box. Silver chloride immediately precipitates, and the mixture is then filtered, to obtain a clear yellow solution. This active yellow catalyst solution is added to the monomer solution via a syringe and the reaction mixture is then allowed to stir for 20 hours at 60° C. Solids that form typically precipitate in the solution. The solution is cooled, concentrated in a rotary-evaporator, and precipitated into hexane to obtain the polymer.

EXAMPLE 6

The procedure of Example 4 is repeated except that 1.4 g of the polymer from Example 5 is used and the solvent consists of 4.58 g g-butyrolactone and 4.58 g 2-heptanone. Typically, adhesion is improved and little or no swelling of the resist features is observed.

EXAMPLES 7–22

Polymers useful as photo resist binders are shown in the following Table. Such polymers are prepared according to the procedures described in Examples 3 or 5, as noted in the Table.

TABLE

| Example | Monomer 1 Mol % | Monomer 2 Mol % | Monomer 3 Mol % | Polymer Preparation |
|---|---|---|---|---|
| 7 | [structure] 33 | [structure] 33 | [structure] 33 | Example 5 |
| 8 | [structure] 33 | [structure] 33 | [structure] 33 | Example 5 |
| 9 | [structure] 33 | [structure] 33 | [structure] 33 | Example 5 |
| 10 | [structure] 50 | [structure] 50 | — | Example 3 |

| Example | Monomer 1 Mol % | Monomer 2 Mol % | Monomer 3 Mol % | Polymer Preparation |
|---|---|---|---|---|
| 11 | 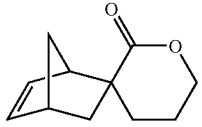 50 | 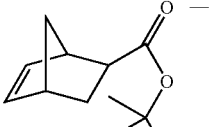 50 | — | Example 3 |
| 12 | 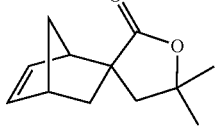 50 | — | 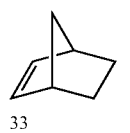 33 | Example 3 |
| 13 | 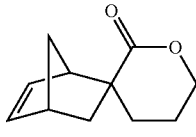 50 | — | 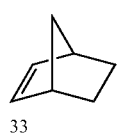 33 | Example 3 |
| 14 | 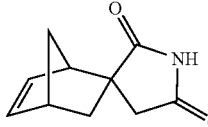 33 | 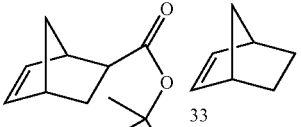 33 | 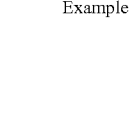 33 | Example 5 |
| 15 | 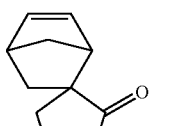 50 | 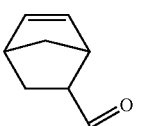 50 | — | Example 5 |
| 16 | 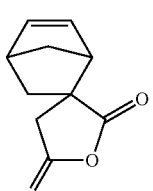 40 | 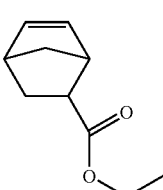 60 | — | Example 5 |

TABLE-continued
| Example | Monomer 1 Mol % | Monomer 2 Mol % | Monomer 3 Mol % | Polymer Preparation |
|---|---|---|---|---|
| 17 | 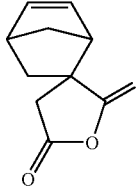 30 | 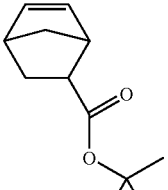 70 | — | Example 5 |
| 18 | 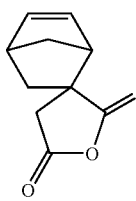 30 | 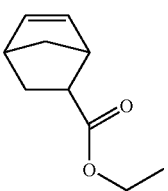 40 | 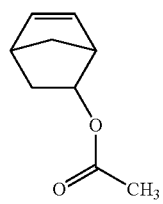 30 | Example 5 |
| 19 | 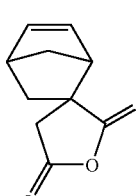 40 | 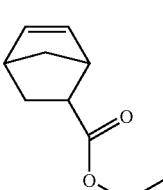 50 | 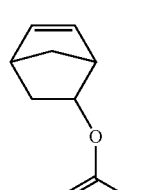 10 | Example 5 |
| 20 | 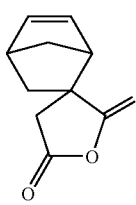 30 | 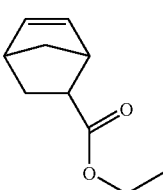 50 | 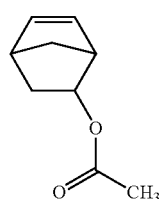 20 | Example 5 |
| 21 | 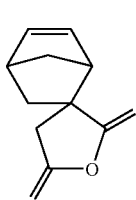 20 | 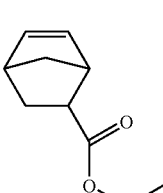 50 | 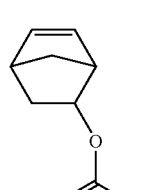 30 | Example 5 |

TABLE-continued

| Example | Monomer 1 Mol % | Monomer 2 Mol % | Monomer 3 Mol % | Polymer Preparation |
|---|---|---|---|---|
| 22 | 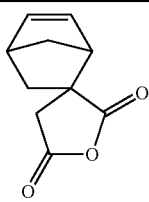 30 | 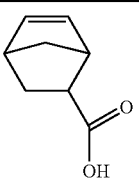 40 | 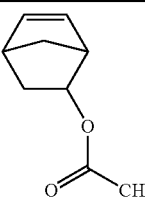 30 | Example 5 |

EXAMPLE 23

The following polymer was prepared.

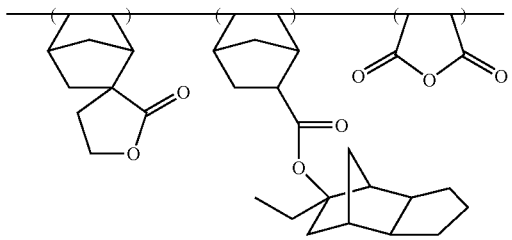

A mixture of norbornene ethyltricyclodecane carboxylate (15.16 g), maleic anhydride (6.60 g), norbornene-spiro-butylactone (2.80 g), and dimethyl 2,2'-azobis(2-methylpropionate) (0.31 g, 1 mole % of total monomers) in 12.28 g ethyl acetate was placed in a round-bottomed flask. After stirring for 5 minutes (until all solids were dissolved), the flask was put into a pre-heated 70° C. oil bath. The reaction mixture was stirred at this temperature for 24 hours. After cooling, 25.0 g of tetrahydrofuran was added. The polymer was isolated by precipitation into 1.5 L of hexane/isopropanol (1/1, w/w.). The resulting suspension was stirred for 120 minutes. The polymer was filtered off and washed with an additional 200 mL of hexane. The polymer was dried in a vacuum oven at 40° C. overnight. The overall yield was 25%.

EXAMPLE 24

The polymer norborene/(spiro-2-2-α-butyrolactone)-5-norborene/norbornene ethyl tricyclodecane carboxylate/maleic anhydride (7.5/7.5/35/50 mol %) was prepared.

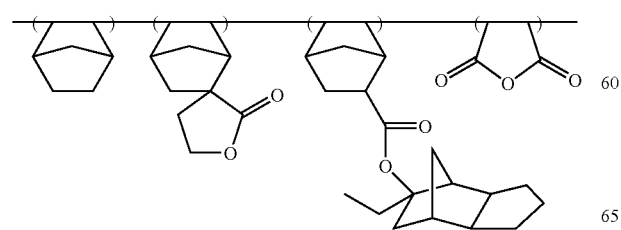

Into a 100 mL round bottom flask were added norbornene 1.22 g (0.013 mol), (spiro-2-2-α-butyrolactone)-5-norborene 2.13 g (0.013 mol), maleic anhydride 8.86 g (0.086 mol), norbornene ethyl tricyclodecane carboxylate 18.8 grams (0.060 moles), dimethyl 2,2'-azobis(2-methylpropionate) 0.4 g (0.0017 mol) and 15 g ethyl acetate. A magnetic stir bar was added to the flask and the solution was stirred for approximately 15 minutes to dissolve the solids. Once all the solids were dissolved, the flask was placed in a hot oil bath that was preheated to 80° C. A condenser and nitrogen line were attached on top and the reaction was allowed to stir for 24 hours. After 24 hours the heat was removed and the flask was allowed to cool to room temperature. After cooling, the contents of the flask was precipitated into 1.5 L of hexanes/isopropanol (50/50 w/w). The precipitated solution was stirred for 1.5 hours and then the polymer was isolated via a glass fritted funnel. The polymer was then dried for 4 hours in a hood and then overnight in vacuum oven at room temperature. This reaction yielded 15 grams of polymer (50%).

EXAMPLE 25

Photoresists containing the polymers of Examples 7 to 22 are prepared by according to Examples 4 or 6, except that the polymers are taken up in γ-butyrolactone.

What is claimed is:
1. A polymer comprising as polymerized units
   (i) one or more spirocyclic olefin monomers of formulae I or II

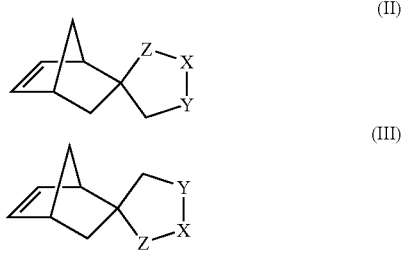

wherein Z=CH$_2$, C(O), C(S), O or S; X and Y are independently chosen from CH$_2$, C(O), C(S), O or NR$^2$; and R$^2$=(C$_1$–C$_8$)alkyl or substituted (C$_1$–C$_8$) alkyl; provided that at least one of X, Y and Z is selected from C(O) and C(S); and (ii) one or more cyclic olefin monomers having one or more substituent groups chosen from $(C_1-C_{12})$halohydroxyalkyl; wherein the spirocyclic monomer is optionally substituted.

2. The polymer of claim 1 wherein the cyclic olefin monomer is chosen from cyclopentene, cyclopentadiene, dicylopentene, cyclohexene, cyclohexadiene, cycloheptene, cycloheptadiene, cyclooctene, cyclooctadiene, norbornene, and maleic anhydride.

3. The polymer of claim 1 wherein the $(C_1-C_{12})$halohydroxyalkyl substituent is $(CH_2)_{n'}C(CF_3)_2OH$ where n'=0 to 4.

4. The polymer of claim 1 further comprising as polymerized units one or more cyclic olefin monomers having one or more substituent groups chosen from carbo$(C_1-C_{20})$alkoxy and $(CH_2)n'C(CF_3)_2$—O-LG; wherein n'=0 to 4, wherein LG is a leaving group having 4 or more carbon atoms with at least one quaternary carbon atom bonded directly to the carboxyl group.

5. The polymer of claim 4 wherein the carbo$(C_1-C_{20})$alkoxy substituent has the formula C(O)O-LG, wherein LG is a leaving group having 4 or more carbon atoms with at least one quaternary carbon atom bonded directly to the carboxyl group.

6. The polymer of claim 5 wherein the leaving group is chosen from isobutyl, 2,3-dimethylbutyl, 2,3,4-trimethylpentyl and alicyclic leaving groups.

7. A photoresist composition comprising one or more polymers of claim 1 and one or more photoactive components.

8. The photoresist of claim 7 wherein the photoactive component is chosen from photoacid generators and photobase generators.

9. A method of forming a relief image comprising the steps of applying a coating layer of the photoresist composition of claim 8, exposing the photoresist coating layer to patterned actinic radiation; and developing the exposed photoresist coating layer to provide a relief image.

* * * * *